US005693447A

United States Patent [19]

Takeyama et al.

[11] Patent Number: 5,693,447

[45] Date of Patent: Dec. 2, 1997

[54] IMAGE FORMING MATERIAL, METHOD OF PREPARING THE SAME AND IMAGE FORMING METHOD EMPLOYING THE SAME

[75] Inventors: Toshihisa Takeyama; Ai Katsuda; Tomonori Kawamura; Masataka Takimoto; Yoshitaka Goto, all of Hino, Japan

[73] Assignee: Konica Corporation, Tokyo, Japan

[21] Appl. No.: 599,152

[22] Filed: Feb. 9, 1996

[30] Foreign Application Priority Data

| | | | |
|---|---|---|---|
| Feb. 17, 1995 | [JP] | Japan | 7-029477 |
| Apr. 11, 1995 | [JP] | Japan | 7-085487 |
| Apr. 11, 1995 | [JP] | Japan | 7-085488 |
| Apr. 28, 1995 | [JP] | Japan | 7-105069 |
| Apr. 28, 1995 | [JP] | Japan | 7-105071 |

[51] Int. Cl.$^6$ ..... G03F 7/34; G03F 7/039

[52] U.S. Cl. ..... 430/201; 430/200; 430/253; 430/270.1; 430/271.1; 430/964; 428/409; 428/411.1; 428/143; 428/423.1; 428/479.1; 428/522; 428/689; 428/692; 428/900; 428/913; 503/227

[58] Field of Search ..... 430/200, 201, 430/964, 253, 254, 270.1, 271.1; 428/409, 900, 913, 143, 423.1, 479.1, 522, 692, 689, 411.1; 503/227

[56] References Cited

U.S. PATENT DOCUMENTS

| | | | |
|---|---|---|---|
| 4,245,003 | 1/1981 | Oransky et al. | 430/200 |
| 4,588,674 | 5/1986 | Stewart et al. | 430/201 |
| 4,626,493 | 12/1986 | Butters et al. | 430/201 |
| 4,702,958 | 10/1987 | Itoh et al. | 430/201 |
| 5,171,650 | 12/1992 | Ellis et al. | 430/201 |
| 5,459,017 | 10/1995 | Topel et al. | 430/201 |
| 5,518,861 | 5/1996 | Coveleskie et al. | 430/200 |

FOREIGN PATENT DOCUMENTS

| | | |
|---|---|---|
| 0 160 396 A2 | 11/1985 | European Pat. Off. . |
| 0 636 490 A1 | 2/1995 | European Pat. Off. . |

*Primary Examiner*—Richard L. Schilling
*Attorney, Agent, or Firm*—Frishauf, Holtz, Goodman, Langer & Chick, P.C.

[57] ABSTRACT

An image forming material is disclosed which comprises a support and provided thereon, an image forming layer containing colorant particles and a binder, the image forming layer having an optical density of 3.0 or more per 1 μm thickness of the image forming layer at λmax which is a wavelength giving a maximum transparent density in the spectral absorption wavelength range of 350 to 1200 nm of the image forming layer, wherein an image is formed by removing exposed portions of the image forming layer of the image forming material.

18 Claims, 4 Drawing Sheets

FIG. 6 (c')

IMAGE FORMING MATERIAL, METHOD OF PREPARING THE SAME AND IMAGE FORMING METHOD EMPLOYING THE SAME

FIELD OF THE INVENTION

The present invention relates to an image forming material, a preparing method of the same and an image forming method using the same which gives high sensitivity, a high density, and a high resolving power.

BACKGROUND OF THE INVENTION

The recording method is well known which comprises the steps of exposing to a high density energy light such as a laser light, an image forming material, whereby a part of the material is deformed, released, burnt or evaporated and removed. This method is a dry process in which a processing solution containing a chemical is not employed, and only the exposed portions are melt-deformed, released or evaporated, which has an advantage resulting in high contrast. This method is used for an optical recording material such as a resist material, an optical disc or an image forming material obtaining a visual image.

Japanese Patent O.P.I. Publication Nos. 59-5447, 59-10553, and 62-115153 disclose a method in which a binder resin is photo-degraded by a pattern exposure to form a resist. Japanese Patent O.P.I. Publication Nos. 55-132536, 57-27788, and 57-103137 disclose a method in which a thin inorganic compound layer provided by evaporation-deposit is exposed to record information by melt-deformation. Japanese Patent O.P.I. Publication Nos. 64-56591, 1-99887, and 6-40163 disclose a method in which a colored binder resin is removed by light heat conversion to record information, and U.S. Pat. No. 4,245,003 disclose an image forming material comprising an image forming layer containing graphite or carbon black.

In Japanese Patent O.P.I. Publication No. 58-18290/1983, PCT Patent No. 4-506709/1992, Japanese Patent O.P.I. Publication No. 6-18290/1994, and U.S. Pat. Nos. 5,156,938, 5,171,650 and 5,256,506 is disclosed an image forming material comprising a light heat converting substance capable of converting absorbed laser light energy to heat energy and a binder capable of being degraded due to heat.

In Japanese Patent O.P.I. Publication No. 58-18290/1983, PCT Patent No. 4-506709/1992, Japanese Patent O.P.I. and U.S. Pat. Nos. 5,156,938, 5,171,650 and 5,256,506 is disclosed an image forming method which receives, on an image receiving sheet, an image forming layer to have been degraded and released.

Further, in Japanese Patent O.P.I. Publication Nos. 4-327982/1992 and 4-327983/1992 is disclosed an image forming method comprising the steps of (a) exposing to a laser light an image forming layer comprising a support and provided thereon, a light heat converting layer, which is also an evaporation layer, containing a light heat converting substance and a image forming layer in that order, whereby the evaporation layer is melted and changes its adhesion to the support, (b) superposing an image receiving layer on the image forming layer, and (c) peeling the image receiving layer from the image forming layer to form an image.

According to these methods, although the problems that the image forming layer, which is exposed and released, pollutes an image forming apparatus is solved, an excellent image is difficult to obtain when an air layer is present, and a defectless high density image is difficult to obtain on the image receiving sheet. On the other hand, when a high density image is formed not on the image receiving layer side but on the image forming material, there has been a problem that exposed portions of the image forming layer is not sufficiently removed, an image with low fog and no image defects is not obtained, and satisfactory resolving power and sensitivity can not be obtained.

SUMMARY OF THE INVENTION

Figure 1:
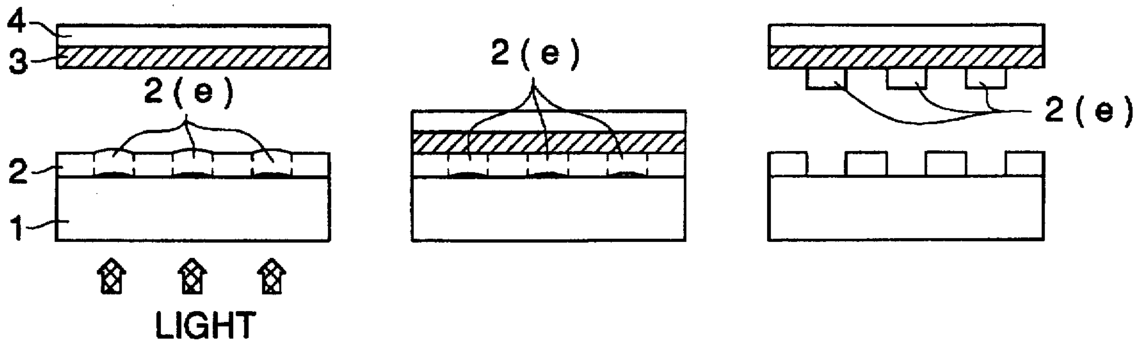
FIGS. 1(*a*), 1(*b*) and 1(*c*) show one of an image forming process in the invention.

The present invention has been made to overcome the above problems. An object of the invention is to provide an image forming material, a preparing method of the same or an image forming method using the same which gives high sensitivity, a high optical density, no staining and high resolving power.

DETAILED DESCRIPTION OF THE INVENTION

The above object of the invention can be attained by the following.

1 An image forming material comprising a support and provided thereon, an image forming layer containing colorant particles and a binder, the image forming layer having an optical density of 3.0 or more per 1 μm thickness of the image forming layer at λmax which is a wavelength giving the maximum optical density in the spectral absorption wavelength range of 350 to 1200 nm of the image forming layer, wherein an image is formed by removing exposed portions of the image forming layer of the image forming material, 2 The image forming material of 1 above, wherein the colorant particles are metal atom-containing particles.

3 The image forming material of 2 above, wherein the metal atom-containing particles are selected from the group consisting of a metal, an alloy and a metal compound, 4 The image forming material of 2 above, wherein the content of the metal atom-containing particles is 70 to 99 weight, 5 The image forming material of 4 above, wherein the content of the metal atom-containing particles is 70 to 95 weight %, 6 The image forming material of 2 above, wherein the content of the metal atom-containing particles is 20 to 80 volume %, 7 The image forming material of 2 above, wherein the metal atom-containing particles have an average particle size of 0.03 to 0.50 μm, 8 The image forming material of 2 above, wherein the metal atom-containing particles are in a needle form, 9 The image forming material of 2 above, wherein the metal atom-containing particles are magnetic particles, 10 The image forming material of 9 above, wherein before the image forming, the image forming layer is passed through a magnetic field, 11 The image forming material of 10 above, wherein after the image forming, the image forming layer is subjected to a calendar treatment, 12 The image forming material of 1 above, wherein the binder is polyurethanes, polyesters or vinyl chloride resins, 13 The image forming material of 12 above, wherein the binder is resins containing a repeating unit containing a polar group selected from the group consisting of $—SO_3M$, $—OSO_3M$, —COOM and $—PO(OM_1)_2$, wherein M represents a hydrogen atom or an alkali atom; and $M_1$ represents a hydrogen atom, an alkali atom or an alkyl group, 14 The image forming material of 2 above, wherein the carbon black content of the image forming layer is 0.5 to 15 weight % based on the content of the metal atom-containing particles, 15 The image forming material of 1 above, wherein the thickness of the image forming layer is 0.1 to 5.0 μm, 16 The image forming material of 15 above, wherein the thickness of the image forming layer is 0.1 to 1.0 μm, 17 The image forming material of 1 above, wherein a backing layer is provided on the support opposite the image forming layer, 18 The image forming material of 1 above, further containing an anti-static agent, 19 The image forming material of 1 above, wherein the thickness of the support is 10 to 500 μm, 20 The image forming material of 1 above, wherein a peeling layer is provided on the image forming layer, 21 The image forming material of 20 above, wherein the peeling layer comprises fine particles, a part of the fine particles protruding from the peeling layer surface, and the number of fine particles having the protruding height of 1 to 20 μm being 10 or more per $mm^2$ of the peeling layer, 22 The image forming material of 20 above, wherein the surface roughness $R_a$ of the peeling layer surface facing the image forming layer is 0.04 to 1.0 μm, which is measured according to JIS B 0601, 23 An image forming method using an image forming material comprising a support and provided thereon, an image forming layer containing colorant particles and a binder, and having a 3.0 or more optical density 3.0 per 1 μm thickness of the image forming layer at λmax which is a wavelength giving the maximum optical density in the spectral absorption wavelength range of 350 to 1200 nm of the image forming layer, the method comprising the steps of:

imagewise exposing the image forming layer of the image forming material; and then removing exposed portions of the image forming layer to form an image, 24 The image forming method of 23 above, wherein before the removing step, adhesion between the support and the exposed portions of the image forming layer is lowered, 25 The image forming method of 23 above, wherein a peeling layer is provided on the image forming layer, before the removing step, adhesion between the support and the exposed portions of the image forming layer is lowered, and the removing is carried out by separating the peeling layer from the image forming layer to transfer the exposed portions of the image forming layer to the peeling layer, 26 The image forming method of 23 above, wherein the imagewise exposing is carried out using a laser light, or 27 The image forming method of 26 above, wherein the laser light has a wavelength of 600 to 1200 nm.

The invention will be explained in detail below.

The image forming material of the invention provides an image forming layer on a support, the image forming layer having a specific range optical density per a unit thickness of the image forming layer and containing metal-containing particles preferably in a specific range amount by weight or by volume. The support includes a resin film such as polyacrylate, polymethacrylate, polyethyleneterephthalate, polybutyleneterephthalate, polyethylenenaphthalate, polycarbonate, polyvinyl chloride, polyethylene, polypropylene, polystyrene, nylon, aromatic polyamide, polyether etherketone, polysulfone, polyether sulfone, polyimide or polyether imide, or a film in which the above two or more resin films are laminated.

The support used in the invention is preferably obtained by orienting resins in the film form and heat-setting in view of dimensional stability, and has a transparency of preferably 50% or more and more preferably 70% or more, since exposure is carried out from the support side when the image forming method as described later is employed. The support may contain a filler such as titanium oxide, zinc oxide, barium sulfate or carcium carbonate, a colorant or an anti-static agent as long as it does not inhibit the effects of the invention.

The thickness of the support in the invention is preferably 10 to 500 μm, and more preferably 25 to 250 μm.

The image forming layer of the image forming material used in the invention comprises colorant particles and a binder.

Colorant particles having an absorption in the wavelength of from 350 to 1200 nm can be suitably used in the image forming layer. The colorant particles may be used singly or in combination of two kinds or more. In the image forming method described later, which reduces an adhesion between the image forming layer and the support by means of a high density energy light, the image forming layer preferably contain a compound (hereinafter referred to as a light-heat converting substance).

Such a light-heat converting substance can be optionally selected from an organic compound and/or an organic compound and used. The organic compound includes, for example, dyes dispersed in the image forming layer which have an absorption in the wavelength range of 600 to 1200 nm, such as cyanine dyes, rhordanine dyes, oxonol dyes, carbocyanine dyes, dicarbocyanine dyes, tricarbocyanine dyes, tetracarbocyanine dyes, pentacarbocyanine dyes, styryl dyes, pyrilium dyes, and metal-containing dyes such as metal phthalocyanines and metal porphyrins. Concretely, compounds disclosed in Chem. Rev. 92, 1197(1992) can be used. The inorganic compound, which has an absorption in the wavelength range of 600 to 1200 nm, includes graphite, carbon black, metal powder particles such as iron, nickel, zinc, aluminum, molybdenum, tungsten, copper, lead and tin, alloy powder particles such as iron-aluminum, iron-cobalt and lead-tin, metal oxide powder particles such as tricobalt tetroxide, ferric oxide, chromium oxide, copper oxide, and titan black, a metal nitride such as niobium nitride, metal carbide particles such as tantalum carbide, and a metal sulfide. Various magnetic powder particles can be suitably used.

As the compound having an absorption in the wavelength range of 350 to 1200 nm, the same organic compound and/or inorganic compound as the light-heat converting substance can be used in addition to the compound having an absorption in the wavelength range of 600 to 1200 nm. The organic compound includes various dyes or pigments which are well known, and the inorganic compound includes inorganic pigments, metal powdered particles, metal oxide powdered particles, a metal nitride, a metal carbide particles and a metal sulfide which are well known.

It is preferable that the above colorant particles are uniformly dispersed in the image forming layer and the colorant particles are not porous, since the remaining rate of the image forming layer to be removed on exposing to a high density light and forming an image is small, which will be detailed later.

The non-porous compound having an absorption in the wavelength range of 350 to 1200 nm, which also works as a light heat converting substance is preferably metal atom containing particles in view of its stability, and is preferably metal-containing dyes such as metal phthalocyanines and porphyrins, and inorganic metal particles. Of these, inorganic metal particles having a relatively uniform shape and size are more preferable in high dissolving power, and as such particles metal particles such as simple metal substance particles and alloy particles consisting of one or two or more kinds of metals, and inorganic metal compounds such as their oxides, nitrides and carbides are used. Of these compounds, various magnetic powders are preferably used. In order to obtain high resolving power, the grain size of the particles is preferably 0.03 to 0.50 μm, and more preferably 0.05 to 0.30 μm. For example, when the magnetic powder particles are used, ferromagnetic ferric oxide powder particles, ferromagnetic metal powder particles, and cubic, tabular powder particles are used, and ferromagnetic ferric oxide powder particles and ferromagnetic metal powder particles are suitably used.

The ferromagnetic ferric oxide powder particles as the magnetic powder particles include $\gamma$-$Fe_2O_3$, $Fe_3O_4$, and an intermediate ferric oxide thereof, $Fe_xO$ ($1.33<x<1.50$).

Examples of the ferromagnetic metal powder particles include ferromagnetic metal powders such as Fe type, Co type, Fe-Al type, Fe-Al-Ni type, Fe-Al-Zn type, Fe-Al-Co type, Fe-Al-Ca type, Fe-Ni type, Fe-Ni-Al type, Fe-Ni-Co type, Fe-Ni-Zn type, Fe-Ni-Mn type, Fe-Ni-Si type, Fe-Ni-Si-Al-Mn type, Fe-Ni-Si-Al-Zn type, Fe-Ni-Si-Al-Co type, Fe-Al-Si type, Fe-Co-Ni-P type, Fe-Co-Al-Ca, Ni-Co type, and magnetic metal powders whose principal components are Fe, Ni and Co. Of them, Fe type metal powders are preferable, and include Co containing iron oxides such as Co containing $\gamma$-$Fe_2O_3$, Co coating $\gamma$-$Fe_2O_3$, Co containing $\gamma$-$Fe_3O_4$, Co coating $\gamma$-$Fe_3O_4$, and Co containing magnetic $FeO_x$ ($4/3<x<3/2$).

In view of corrosion-resistance and dispersibility the preferred are Fe-Al type ferromagnetic metal powders including Fe-Al type, Fe-Al-Ca type, Fe-Al-Ni type, Fe-Al-Zn type, Fe-Al-Co type, Fe-Ni-Si-Al-Co type and Fe-Co-Al-Ca type. Of these powders, the preferable are ferromagnetic powder in which the content ratio of a Fe atom to an Al atom is 100:1 to 100:20 and the content ratio at 100 ÅÅ depth of a Fe atom to an Al atom is 30:70 to 70:30 measured through ESCA (electron spectroscopy for chemical analysis) or ferromagnetic powder containing at least one of Fe, Ni, Al, Si, Co and Ca in which the Fe content is 90 atom % or more, the Ni content is 1 to 10 atom %, the Al content is 0.1 to 5 atom %, the Si content is 0.1 to 5 atom %, the Co or Ca content (or the sum content of Co and Ca) is 0.1 to 13 atom %, and the content ratio by the number of atom at 100 ÅÅ depth, Fe:Ni:Al:Si:(Co and/or Ca) is 100:(not more than 4):(10 to 60):(10 to 70):(20 to 80), measured through ESCA (electron spectroscopy for chemical analysis).

The shape of the ferromagnetic powder particles is preferably a needle to orient the particles. The average size of the particles is represented by an average major axial length, and the average major axial length is usually not more than 0.30 μm, and preferably not more than 0.20 μm. Employing these particles, an image is obtained in which a residual image forming layer is reduced, after the layer is removed in exposing to a high density energy light and the surface property of the image forming layer is improved. The average size of the particles is obtained by measuring major axial lengths of one hundred particles using a microscope, and then computing the average.

It is preferable that the coercive force (Hc) of the ferromagnetic powder particles be within the range of 600 to 5,000 ersted, the saturation magnetization quantity ($\sigma_s$) is less than 70 emu/g, and the particles have a specific surface area not less than 30 $m^2/g$ according to a BET method.

The colorant particles content of the image forming layer is 70 to 99 weight %, and preferably 75 to 95 weight %.

Typical binders used in the invention are polyurethanes, polyesters, and vinyl chloride type resins such as vinyl chloride copolymers. Preferably, these resins contain repeated units having at least one polar group selected from $-SO_3M$, $-OSO_3M$, $-COOM$ and $-PO(OM_1)_2$·wherein M represents a hydrogen atom or an alkali metal atom, $M_1$ represents a hydrogen atom, an alkali metal atom or an alkyl group. These polar groups have a function to enhance dispersibility of colorant particles and are contained in the resin at a rate ranging from 0.1 to 8.0 mol %, preferably from 0.5 to 6.0 mol %.

The binders can be used either singly or in combination of two or more kinds; when these are used in combination, the ratio of polyurethane and/or polyester to vinyl chloride type resin is within the range of usually 90:10 to 10:90, preferably 70:30 to 30:70 in weight ratio.

The polar group containing polyvinyl chloride is prepared by reaction of a hydroxy group containing resin such as vinyl chloride-vinyl alcohol copolymer with a polar group such as $ClCH_2CH_2SO_3M$, $ClCH_2CH_2OSO_3M$, $ClCH_2COOM$ or $ClCH_2P(=O)(OM_1)_2$, or a chlorine atom containing compound. One example thereof is as follows:

$$-CH_2C(OH)H- + ClCH_2CH_2SO_3Na \rightarrow -CH_2C(OCH_2CH_2SO_3Na)H-$$

The polar group containing polyvinyl chloride resin is prepared by polymerization of a reactive monomer having a double bond and a polar group in the presence of a radical initiator such as benzoyl peroxide or azobisisobutylonitrile, a redox initiator or a cation polymerization initiator in an autoclave.

The monomer to incorporate a sulfonic acid or its salt includes an unsaturated hydrocarbon sulfonic acid such as vinyl sulfonic acid, allyl sulfonic acid, methacryl sulfonic acid or p-styrene sulfonic acid and its salt. In order to incorporate a carboxylic acid or its salt, for example, (meth) acrylic acid or maleic acid may be used, and in order to incorporate a phosphoric acid or its salt, for example, (meth)acryl-2-phosphate may be used.

Further, in order to improve thermal stability of a binder, an epoxy group is preferably incorporated in a vinyl chloride copolymer. The content of a unit having an epoxy group in the copolymer is 1 to 30 mol %, preferably 1 to 20 mol %. The monomer to incorporate epoxy is preferably glycidyl acrylate.

The polar group containing polyester is prepared by condensation reaction of a polyol with a polybasic acid having a polar group. The polybasic acid having a polar group includes 5-sulfoisophthalic acid, 2-sulfoisophthalic acid, 4-sulfoisophthalic acid, 3-sulfophthalic acid, 5-sulfoisophthalic acid dialkyl, 2-sulfoisophthalic acid dialkyl, 4-sulfoisophthalic acid dialkyl and 3-sulfophthalic acid dialkyl, or a metal salt thereof, and the polyol includes trimethylolpropane, hexane triol, glycerin, trimethylolethane, neopentyl glycol, pentaerythritol, ethylene glycol, propylene glycol, 1,3-butane diol, 1,4-butane diol, 1,3-hexane diol, 1,6-hexane diol, diethylene glycol and cyclohexane dimethanol.

The polar group containing polyurethane is prepared by reaction of a polyol with a polyisocyanate. The polyol includes polyol polyester prepared by reaction of polyol with a polybasic acid having a polar group. The polyisocyanate includes diphenylmethane-4,4-diisocyanate, 2,4-tolylene diisocyanate, 2,6-tolylene diisocyanate, 1,5-naphthalene diisocyanate and lydin isocyanate methylester. The other preparation method of the polar group containing polyurethane includes a reaction of polyurethane having a hydroxy group with a compound containing a polar group and a chlorine atom such as $ClCH_2CH_2SO_3M$, $ClCH_2CH_2OSO_3M$, $ClCH_2COOM$ or $ClCH_2P(=O)(OM_1)_2$.

Besides the above resins, the binder resin includes vinyl chloride resins such as vinyl chloride-vinyl acetate copolymers, polyolefins such as butadien-acrylonitrile copolymers, polyvinyl acetals such as polyvinyl butyrals, cellulose derivatives including nitrocellulose, styrene resins such as styrene-butadiene copolymers, acryl resins such as acrylate resins, polyamide resins, phenolic resins, epoxy resins, and phenoxy resins.

The binder content of the image forming layer is 1 to 30 weight %, and preferably 5 to 25 weight %.

The DBP oil absorption of carbon black in the image forming layer is preferably 20 ml/100 g to 500 ml/100 g. The oil absorption herein referred to is an addition amount (ml) of dibutyl phthalate (DBP) necessary to obtain one lump from the dispersion form when DBP is gradually added to 100 g of pigment while kneading. The average particle size of carbon black is preferably 10 to 200 nm, which is measured by an electron microscope. The addition of carbon black to the image forming layer gives high optical density per unit thickness of the layer, resulting in less remaining of the layer which is exposed to a high density energy light and removed. The anti-static effect is given to the image forming layer and dust adhesion is prevented which causes image defects.

The addition method of carbon black can be varied. The fine and crude particles of carbon black are mixed at the same time in a dispersion machine, or a part thereof is firstly mixed and dispersed, and then the remaining is added. When dispersibility of carbon black is important, carbon black is kneaded together with other additives through a three roller mill or a Banbury mixer and then, is dispersed through a dispersion machine. So called "carbon master batch method" can be also employed in which carbon black is pre-dispersed together with a binder.

The image forming layer may contain additives such as lubricants, durability improvers, dispersing agents, abrasive materials, fillers and hardeners, as long as the effects of the invention are not inhibited.

The lubricants include fatty acids, fatty esters, fatty acide amide, (modified) silicone oils, (modified) silicone resins, fluorinated resins, and fluorinated carbons, and durability improvers include polyisocyanates.

The dispersing agents include compounds disclosed in column 0093 of Japanese Patent O.P.I. Publication No. 4-21428/1992. The antistatic agents include a cationic surfactant, an anionic surfactant, a nonionic surfactant, a polymeric antistatic agent and conductive fine particles and compounds described on pages 875 and 876, 11290 Chemicals, edited by Kagaku Kogyo Nippo Co. Ltd. The fillers include inorganic fillers such as carbon black, graphite, $TiO_2$, barium sulfate, ZnS, $MgCO_3$, $CaCO_3$, ZnO, CaO, $WS_2$, $MoS_2$, MgO, $SnO_2$, $SiO_2$, $Al_2O_3$, $\alpha$-$Fe_2O_3$, $\alpha$-FeOOH, SiC, $CeO_2$,, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles.

The harders are used without any limitations as long as they can harden the image forming layer, and include, for example, polyisocyanates which are used in preparing polyurethanes for the binder described above.

The hardeners harden the image forming layer and give the image having high durability, and stains at image portions can be reduced in the image forming method described later.

The addition amount of the additives in the image forming layer is 0 to 20 weight. %, and preferably 0 to 15 weight %.

The thickness of the image forming layer is preferably 0.05 to 5.0 μm, more preferably 0.1 to 5.0 μm, still more preferably 0.1 to 2.0 μm and most preferably 0.2 to 1.0 μm. Such a thickness makes it possible to form an image by exposure of a high density energy light with low energy, in other words, with high sensitivity. The image forming layer may be a single layer or multiple layers whose compositions may be the same or different. In the multiple layers, the layer closest to a support preferably contains a light heat converting substance in view of sensitivity.

The image forming layer is preferably thinner in view of resolving power when exposed portions of the image forming layer are removed according to an image forming method described later. However, since a high density energy light is not effectively absorbed when the optical density is low, it is preferable that the optical density at $\lambda max$ per 1 μm of the image forming layer is 3.0 or more preferably 3.5 or more, and most preferably 4.0 or more, wherein $\lambda max$ is a wavelength giving a maximum transparent density in a spectral absorption wavelength range of 350 to 1200 nm, or the transparent density at a wavelength of a high density energy light per 1 μm of the image forming layer is 3.0 or more.

The preferable embodiment of the invention is that the transmittance at $\lambda min$ per 1 μm of the image forming layer is 0.1% or less, preferably 0.05% or less, and more preferably 0.03% or more, wherein $\lambda min$ is a minimum transmittance wavelength in a spectral absorption wavelength range of 350 to 1200 nm.

Besides the support or image forming layer described above, the image forming material in the invention preferably comprises a backing layer on a support opposite the image forming layer to prevent static charge, improve transportability or prevent blocking.

The backing layer is provided on a support using a backing layer forming composition available on the market or a support having thereon a backing layer is used. When the backing layer is newly provided, a conventional backing layer composition is used according to various objects.

When the binding force between a support and an image forming layer is enhanced, coatability of the image forming layer is improved or antistatic of an image forming material is necessary, an intermediate layer according to the individual object is preferably provided, as long as the effect of the invention is not inhibited. The conventional intermediate layer is provided according to various objects.

The thickness of the intermediate layer or backing layer is preferably 0.01 to 10 μm, and more preferably 0.1 to 5 μm.

As a peeling layer, which is provided on a support to transfer an image by imagewise exposing and peeling in the image forming method described later, a self-supportable resin or the above described resin film used for a support may be used.

The peeling layer may be also an adhesive layer provided on the resin film on the image forming layer side.

When the adhesion force between an image forming layer and a support is reduced by exposure of a high density energy light to form an image, slight space (voids) between the image forming layer and a peeling layer is preferably provided, whereby the deformation of the image forming layer easily occurs to give an image with high resolving power and without staining at the exposed portions.

The first embodiment of the peeling layer in the invention contains fine particles wherein some particles protrude from the peeling layer and the layer has ten or more particles per 1 $mm^2$ which have a protrusion height of 1 to 20 μm.

Figure 4:
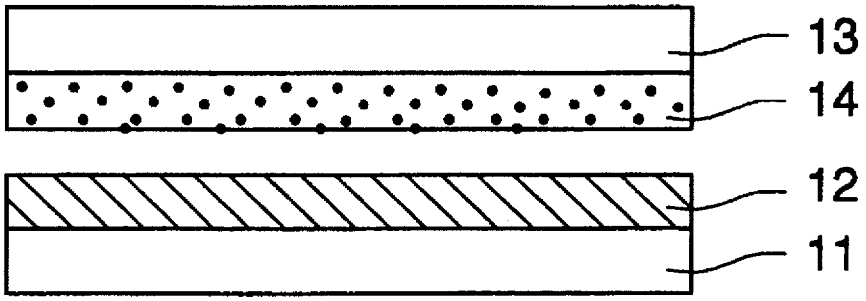
FIG. 4(*a*), 4(*b*) or 4(*c*) shows a preferable embodiment of the image forming material of the invention.
Figure 4:
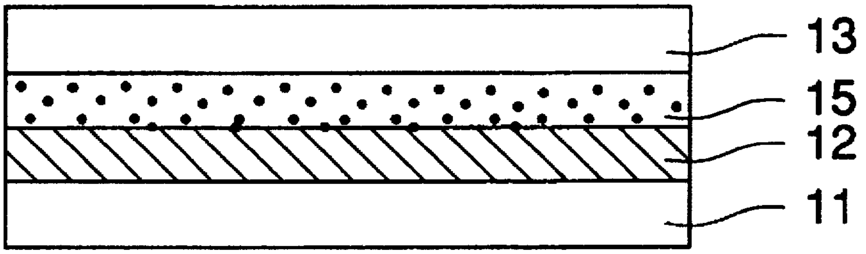
Figure 4:
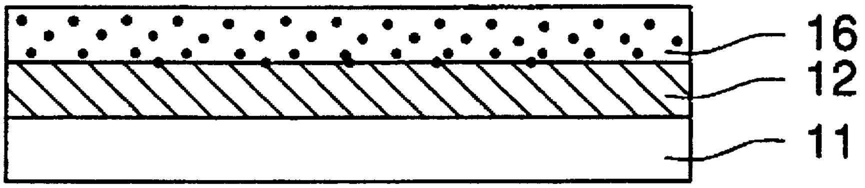
Figure 5:
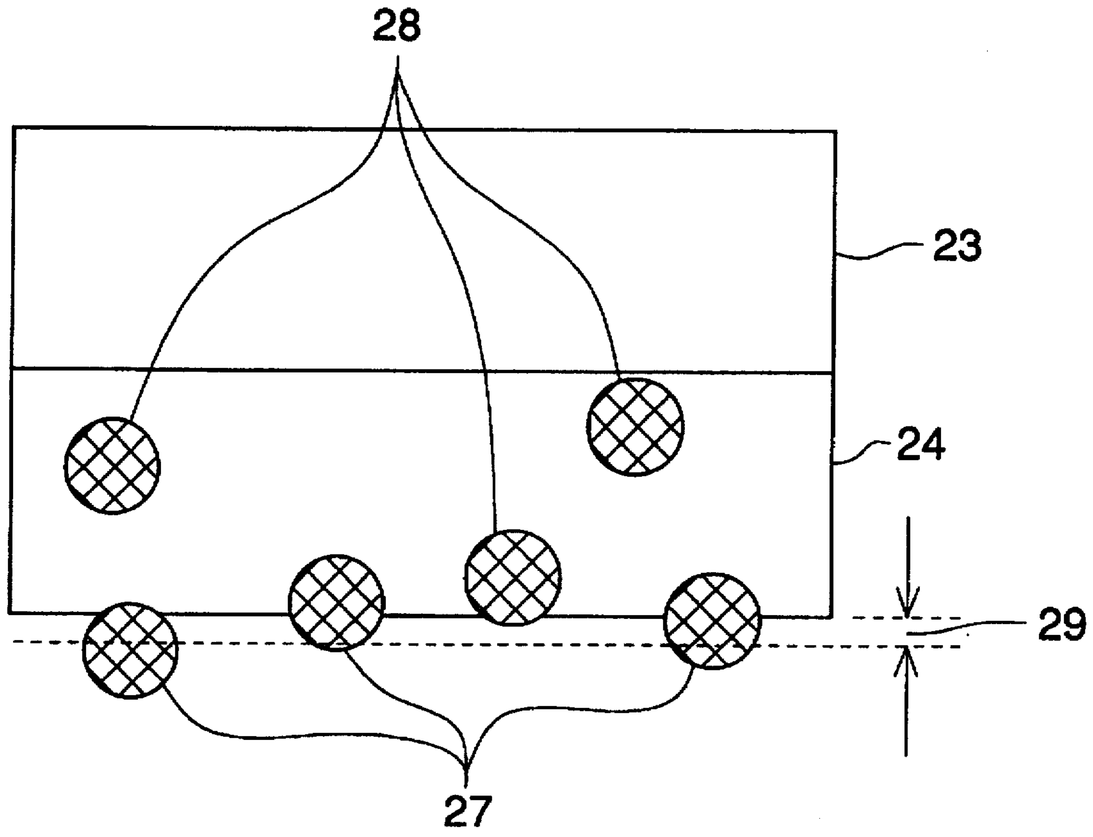
FIG. 5 shows a sectional view of one embodiment of the peeling layer of the invention.

FIG. 4(*a*), 4(*b*) or 4(*c*) is a preferable embodiment of the image forming material of the invention. FIG. 4(*a*) shows a peeling layer 14 containing fine particles provided on a support 13 and an image forming material adjacent to the peeling layer, the image forming material having an image forming layer 12 provided on a support 11. FIG. 4(*b*) shows a peeling layer 15 consisting of polyolefin provided on a support 13 and an image forming material adjacent to the peeling layer, the image forming material having an image forming layer 12 provided on a support 11. FIG. 4(*c*) shows a peeling layer 16 consisting of an extruded and oriented film or a self-supporting film provided on an image forming layer 12 which is provided on a support 11. FIG. 5 shows a sectional view of one embodiment of the peeling layer of the invention. In this peeling layer fine particle containing layer 24 is provided on a support 23, and some particles protrude from the surface. The numeral 29 represents a height of 1 μm, and particles 27 exceed a height of 1 μm and particles 28 fall within a height of 1 μm or buried in the peeling layer 24. It is important in the peeling layer of the invention that the protruded particles 27 meet the above described conditions.

The fine particles, which are added to the peeling layer, may be any particles as long as the above described condition are satisfied, and for example, the above described fillers used in the image forming layer may be used.

The fine particles having an average particle size of not more than 1 μm can not satisfy the above condition.

When the thickness of the peeling layer is more than the average particle size of the fine particles, some fine particles fall outside the above described range, but if the number of the fine particles satisfying the above condition is 10 or more per $mm^2$, it is within the scope of the invention. The addition amount of fine particles is usually 5 $mg/m^2$ to 10 $g/m^2$.

Figure 6:
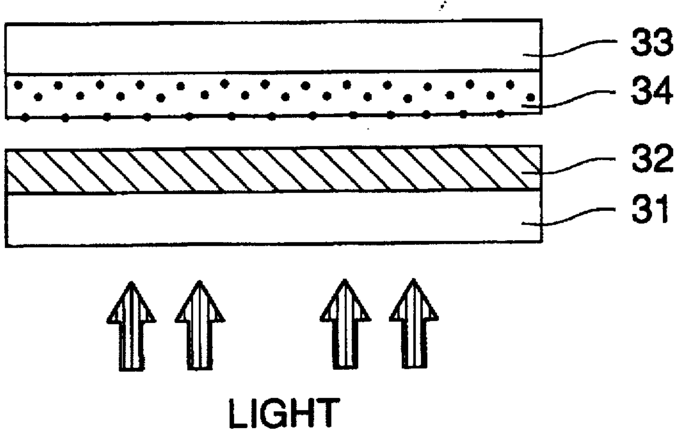
FIGS. 6(*a*), 6(*b*), 6(*c'*) and 6(*c*) show another one of an image forming process in the invention.
Figure 6:
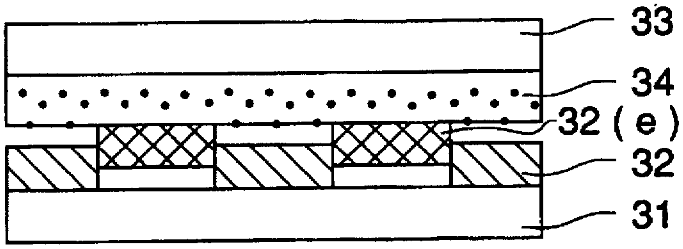
Figure 6:
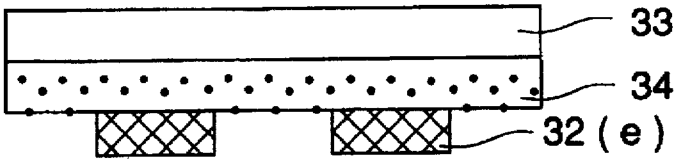
Figure 6:
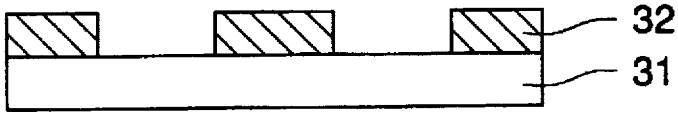

The use of the peeling layer will be explained below using FIGS. 6(*a*), 6(*b*), 6(*c'*) and 6(*c*). The image forming material comprising an image forming layer 32 on a support 31 is superposed on a peeling layer 34 containing fine particles provided on a support 33 as shown in FIG. 6(*a*). The resulting material is imagewise exposed to light from the support 31 side, and the exposed image forming layer 32(*e*) is abraded to form an image as shown in FIG. 6(*b*). The exposed portions 32(*e*) are transferred to the peeling layer side (see FIG. 6(*c'*)), and the peeling layer 34 is peeled from the image forming layer to form an image (see FIG. 6(*c*)).

As a second embodiment of the peeling layer in the invention the surface of the peeling layer on the image forming layer side has a surface roughness $R_a$ of 1.0 to 0.04 μm, which is measured according to JIS B 0601.

The surface roughness is adjusted by incorporating fillers in a peeling layer or by foaming a foaming agent containing peeling layer, wherein the peeling layer contacts an image forming layer. Further, the surface roughness may be adjusted by subjecting to sand blasting or embossing treatment used in a surface treatment.

The surface of the image forming layer is preferably subjected to primer treatment before an olefin resin such as polypropylene is extrusion-laminated as an adhesion layer on the image forming layer.

The primer includes titanium alkoxide, zirconium alkoxide, a metal alkoxide, ethylene-vinyl acetate copolymer, poly vinylidene chloride, an olefin resin such as polybutadiene, a urethane resin, an epoxy resin, a polyester eresin, an acryl resin, and a polyethylene imine resin. The primer further includes the above described resin hardened by a hardening agent such as an isocyanate compound, an amine compound or an acid anhydride or by irradiation of an electron ray such as ultraviolet light. The compound described in Chapter 33 to 36, "Sin Ramineto Kako Ichiram" edited by Kakogijutu Kyokai is suitably used as the primer.

A method providing a primer layer includes a solution coating method coating and drying a primer solution or a melt coating method coating a primer layer composition in a melting state. A solvent using in the solution coating includes water, alcohols, cellosolves, aromatic organic solvents, ketones, esters, ethers and chlorinated solvents. The coating is carried out by a gravure roller method, an extrusion method, a wire-bar method and a roller method as conventionally used.

The thickness of the primer layer is usually 0.001 to 2.0 μm, and preferably 0.01 to 1.0 μm.

The thickness of the peeling layer is usually 5 to 300 μm, and preferably 10 to 100 μm. The thickness of an adhesion layer is usually 0.1 to 40 μm, and preferably 0.3 to 30 μm.

The adhesive layer may be a layer itself having adhesion property, or a layer producing adhesion property by applied heat or pressure, and can be formed using, for example, a low softening point resin, an adhesive or a heat solvent.

The low softening point resin includes an ethylene copolymer such as ethylene-vinylacetate copolymer or ethylene-ethylacrylate copolymer, a polystyrene resin such as styrenebutadiene copolymer, styrene-isoprene copolymer, or styrene-ethylene-butylene copolymer, a polyester resin, a polyolefin resin such as polyethylene or polypropylene, a polyvinyl ether resin, a polyacrylate resin such as polybutylmethacrylate, an ionomer resin, a cellulose, an epoxy resin, and a polyvinyl chloride resin such as colpolyvinylchloride-vinylacetate. The adhesive includes modified or non-modified rosins such as rosin, hydrogenated rosin, rosin-maleic acid, polymeric rosin and rosin phenol, and terpenes and petroleum resins or their modified resins. The heat solvent includes compounds which are solid at ordinary temperature and thermally reversibly liquifies or softens, concretely, monomolevular compounds such as terpineol, mentol, acetoamide, benzamide, cumarine, benzyl cinnamate, diphenylether, crown ether, camphor, p-methylacetophenone, vanilline, dimethoxybenzaldehyde, p-benzyldiphenyl, stilbene, margaric acid, eicosanol, cetylpalmitate, stearic amide, and behenylamine, waxes such as bees wax, candelilla wax, paraffin wax, ester wax, montan wax, carnauba wax, amide wax, polyethylene wax and microcrystalline wax, rosin derivatives such as ester gum, rosin-maleic acid resins and rosin phenol resins, a phenol resin, a ketone resin, an epoxy resin, a diallylphthalate resin, a terpene type hydrocarbon resin, a cyclopentadiene resin, a polyoleffin resin, a polycaprolactam resin, and polyethylene oxides such as polyethylene glycol and polypropylene glycol.

The thickness of the peeling layer is preferably 0.1 to 100 μm, and more preferably 0.5 to 50 μm. The thickness of the adhesive layer is preferably 0.1 to 40 μm, and more preferably 0.3 to 30 μm.

In the invention at least one of the above described support, image forming layer, backing layer, intermediate layer, peeling layer and adhesion layer preferably contains an antistatic agent for the purpose of prevention of blocking and dust adhesion. The antistatic agent is optionally selected from those compounds to be added to the image forming layer.

The image forming layer is formed by kneading colorant particles, a binder, and optionally lubricants, durability improving agents, dispersants, anti-static agents, fillers and hardeners in solvents to obtain a highly concentrated solution, then diluting the solution with the solvents to obtain a coating solution, coating the coating solution on the support and drying.

The solvents include alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone).

The kneaders for an image forming layer composition Suitable examples include two-roll mills, three-roll mills, ball mills, pebble mills, coball mills, Tron mills, sand mills, sand grinders, Sqegvari attritor, high-speed impeller dispersers, high-speed stone mills, high-speed impact mills, dispersers, high-speed mixers, homogenizers, supersonic dispersers, open kneaders, and continuous kneaders.

In order to coat an image forming layer on a support, coating is carried out by an extrusion method. When magnetic powder particles are used as a colorant, calender treatment may be carried out in order to optionally orient the magnetic particles and make uniform the surface of the image forming layer. The magnetic particles may be randomly oriented by non-orienting treatment. These treatments give high resolving power.

Orientation treatment can be carried out, for example, by passing a coated layer through horizontally orienting magnet, vertically orienting magnet or non-orienting magnet, and introducing it into dryer where it is dried with hot air blown from nozzles arranged up and down. The calender treatment can be carried out, for example, by passing a support bearing a dried image forming layer through supercalender and calendering it.

The magnetic field of the horizontally orienting magnet, vertically orienting magnet or non-orienting magnet is 20 to 1000 gauss, the calender is carried out at 50° to 140° C., at a pressure of 50 to 400 kg/cm, and at a transport speed of 20 to 1000 m/minute. The drying is carried out at 30° to 120° C. for 0.1 to 10 minutes.

The image forming layer is likely to have voids, when the content of the metal atom containing particles are high. In such a case, pressure is preferably applied to the layer to reduce voids by calender or pressure treatment, in that a layer remained after the image forming layer has been exposed to a high density energy light and removed is reduced.

In order to reduce the remained layer, pressure is applied to the image forming layer to obtain voids of preferably 30% or less, and more preferably 20% or less. The voids can be measured through a mercury pressure method using a porosimeter.

When the above pressure is not applied to the image forming layer, random orientation of magnetic powder by non-orienting treatment can reduce the remained image forming layer as above described. In this case, voids may be 30% or more. The content by volume of the metal atom containing particles in the image forming layer is usually 20 to 80%, and preferably 50 to 80%, although the content is varied due to specific gravity of the particles or voids of the layer. The content by volume herein is defined as the following equation:

Volume %=theoretical volume of metal atom containing particles per unit area/(volume per unit area of image forming layer, which is obtained by measuring the thickness of image forming layer)×100

When other layers than the image forming layer are provided on the image forming layer side, each layer may be coated separately, and the layers may be multilayer coated by wet-on Wet coating method.

In carrying out wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a cast coater or a spray coater can be used.

The adhesion between upper and lower layers is enhanced, since in the multilayer coating according to the wet-on-wet method the upper layer is coated on the wet lower layer.

When the peeling layer is provided on the image forming layer and the peeling layer is a self-supporting resin, the layer is provided on the image forming layer by dissolving the resin in a solvent to obtain a coating solution and coating the solution on the image forming layer or by fusibly kneading the resin and extrusion-laminating the kneaded resin on the image forming layer. When the resin film used for a support is used as a peeling layer and the film is a heat sealing polyethylene or polypropylene, the film is provided and laminated on the image forming layer by applying heat and pressure using a hot stamp or heat roller to obtain a peeling layer. When the film does not have a heat sealing property, an adhesion layer is provided on the image forming layer. That is, the adhesion layer forming composition is coated on the image forming layer and dried and then laminating the film on the adhesion layer to obtain a peeling layer or, the adhesion layer forming composition is coated and dried on the film or the fusible adhesion layer forming composition is laminated on the film by an extrusion-laminating method, and the resulting adhesion layer is superposed on the image forming layer and is subjected to a heat roller or hot stamp heat and pressure treatment to obtain a peeling layer.

The heat treatment by a heat roller is carried out at room temperature to about 180° C., preferably 30° to 160° C., at a pressure of 0.1 to about 20 kg/cm, 0.5 to 10 kg/cm and at a transporting speed of 1 to 200 mm/second, preferably 5 to 100 mm/second. The heat treatment by a hot stamp is carried out at room temperature to about 180° C., preferably 30° to 150° C., at a pressure of 0.1 to 10 kg/cm$^2$, 0.5 to 5 kg/cm$^2$ for 0.1 to about 50 seconds, preferably 0.5 to 20 second.

Image forming method

In the invention an image can be obtained by the following four image forming methods using the above described image forming material, and the methods will be explained below according to the four methods.

Image forming method 1

The image forming method 1 comprises the steps of imagewise exposing to a high density energy light an image forming material comprising a support and provided thereon, an image forming layer containing metal atom-containing particles from the support side, and removing exposed portions of the image forming layer to form an image.

The image forming layer may be a single layer or two or more layers. The latter includes a light heat converting layer having 600 to 1200 ran wavelength absorption and a colorant layer containing a colorant having 350 to 600 nm wavelength absorption.

The high density energy light used for imagewise exposing fro the support side is not limited, so long as it is a light source capable of removing exposed portions of an image forming layer. In order to obtain a high resolving power, the light source is preferably an electromagnetic wave capable of making the energy spots smaller, particularly, a UV light having 1 nm to 1 mm wavelength, a visible light or an infrared light. Such a high density energy light includes, for example, a laser light, an emission diode, a xenon flush lamp, a halogen lamp, a carbon arc light, a metal halide lamp, a tungsten lamp, a quarts mercury lamp and a high pressure mercury lamp. The energy applied is optionally adjusted by selecting an exposure distance, an exposure time or an exposure strength according to kinds of image forming materials used.

When an entire exposure is carried out using the high density energy light, the exposure is carried out through a mask material having a negative pattern made of a light shielding material.

When an array light such as an emission diode array is used or exposure using a halogen lamp, a metal halide lamp or a tungsten lamp is controlled using an optical shutter material such as liquid crystal or PLZT, a digital exposure according to an image signal is possible, and direct writing is possible without using the mask material.

However, this method requires additional optical shutter beside the light source. Therefore, the digital exposure is preferably carried out using a laser light.

When the laser light is used, the light can be condensed in the beam form and a latent image is formed using a scanning exposure according to an image. The laser light is easy to condense the exposure spots in small size and therefore, a highly dissolved image can be obtained.

The laser light used in the invention is well known. The laser source includes solid lasers such as a ruby laser, a YAG laser, a glass laser, a gas laser such as a He-Ne laser, a Ar laser, a Kr laser, a $Co_2$ laser, a Co laser, a He-Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a laser having a 600 to 1200 nm wavelength, and preferably a 750 to 1200 nm wavelength is preferable in sensitivity in order to remove effectively the exposed portions, since a light energy can be effectively converted to a heat energy. Among laser having the same wavelength is more preferably a laser having a high light intensity.

In the invention the image forming method 1 comprises the steps of imagewise exposing to a high density energy light the image forming layer and removing exposed portions of the image forming layer to form an image. When as the removing method the exposure energy is enough to completely destroy and scatter the exposed portions of the image forming layer, the scattered portions can be removed by attraction and can be effectively removed by an attracting means provided adjacent to the image forming layer.

When the exposure energy of the high density energy light does not completely destroy the exposed portions of the image forming layer, for example, only the reduction of adhesion force at the exposed portions between the support and the image forming layer thereon occurs, the exposed portions can be removed according to an image forming method 3 or 4 described later as well as the above described attraction method.

The reduction of adhesion force referred to herein includes phenomena that the image forming layer completely scatters by its physical or chemical change, a part of the image forming layer scatters and/or is destroyed, or the surface of the image forming layer is not destroyed but only the image forming layer adjacent to the support changes physically or chemically without any change of completely scatters.

Image forming method 2

The image forming method 2 comprises the steps of imagewise exposing to a high density energy light an image forming material comprising a support and provided thereon, an image forming layer containing colorant particles and a binder from the support side, whereby adhesion force at the exposed portions between the support and the image forming layer is reduced, and removing exposed portions of the image forming layer to form an image.

The removing by a high density energy light is carried out according to the above described image forming method 1, or the image forming method 3 or 4 described later.

Image forming method 3

The image forming method 3 comprises the steps of imagewise exposing to a high density energy light the above described image forming material comprising the image forming layer on a support from the support side as shown in FIG. 1(*a*), whereby adhesion force at the exposed portions between the support 1 and the image forming layer 2 is reduced, superposing the image forming layer on an adhesion sheet comprising an adhesive layer 3 on a base 4, facing the adhesive layer as shown in FIG. 1(*b*), and peeling the adhesion sheet from the image forming material whereby the exposed portions 2(*e*) of the image forming layer is transferred to the adhesion sheet to form an image as shown in FIG. 1(*c*).

When in the invention a part of the image forming layer scatters and/or is destroyed due to its physical or chemical change, the exposed portions of the image forming layer can be attracted and removed according to an adhesion sheet method described later as well as the above described attraction method. When such an attraction removing method is difficult, the exposure energy of the high density energy light is preferably adjusted to produce the physical or chemical change only at the layer adjacent to the support.

The adhesion sheet includes an adhesion sheet, a heat sealing sheet and a laminating sheet which are available on the market. When the image forming material contacts the adhesion sheet and pressure or heat-pressure is applied to it, the adhesion sheet can be used without any limitations so long as the pressure or heat-pressure can be applied airtightly. The pressure is applied by means of a pressure roller or a stamper, and the heat-pressure is applied by means of a thermal head, a heat roller or a hot stamp.

When the pressure roller is employed, the pressure is usually 0.1 to 20 kg/cm, and preferably 0.5 to 10 kg/cm and the transport speed is usually 0.1 to 200 m/sec., and preferably 0.5 to 100 m/sec. When the stamper is employed, the pressure is usually 0.05 to 10 kg/cm, and preferably 0.5 to 5 kg/cm and the pressure time is usually 0.1 to 50 seconds, and preferably 0.5 to 20 seconds. The thermal head is used under conditions usually applied in the conventional fusible or sublimation transfer process. When the heat roller is employed, the heat temperature is usually 60° to 200° C., and preferably 80° to 180° C., the pressure is usually 0.1 to 20 kg/cm, and preferably 0.5 to 10 kg/cm and the transport speed is usually 0.1 to 200 mm/sec., and preferably 0.5 to 100 E/sec. When the hot stamper is employed, the heat temperature is usually 60° to 200° C., and preferably 80° to 150° C., the pressure is usually 0.05 to 10 kg/cm, and preferably 0.5 to 5 kg/cm and the pressure time is usually 0.1 to 50 seconds, and preferably 0.5 to 20 seconds.

Various peeling methods can be employed as long as they have no adverse affect on image forming. The peeling method includes a method of peeling the adhesion sheet from the image forming material using a peeling plate or a peeling roller with a fixed peeling angle and a method of manually peeling the adhesion sheet from the image forming material without fixing a peeling angle.

The image forming material having a single image forming layer on a support was described above. When two or more image forming layers are formed on a support, adhesion force between the support and the image forming layer adjacent to the support may be reduced as above described. When plural image forming layers having a different composition are formed on a support, for example, a first image forming layer comprising a light-heat converting substance as a colorant and a second image forming layer comprising a compound having an absorption in the 350 to 1200 nm wavelength are provided in that order on a support, adhesion force between the support and the first image forming layer or adhesion force between the first image forming layer and the second image forming layer may be reduced. When an intermediate layer is provided between an image forming layer and a support, adhesion force between the image forming layer and the intermediate layer may be reduced.

Image forming method 4

Figure 2:
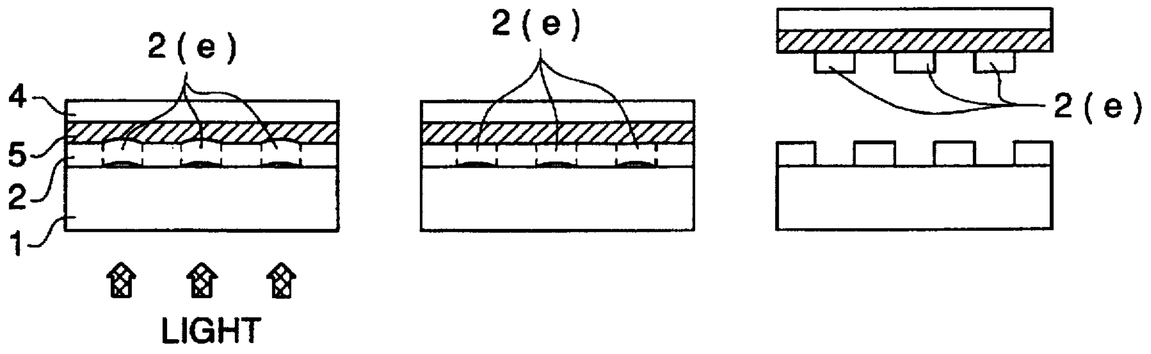
FIGS. 2(*a*), 2(*b*) and 2(*c*) show another one of an image forming process in the invention.

The image forming method 4 comprises the steps of imagewise exposing to a high density energy light an image forming material comprising a peeling layer 5 and a base 4 provided on the image forming layer 2 of the above described image forming material from the support side as shown in FIG. 2(*a*), whereby adhesion force at the exposed portions 2(*e*) between the support and the image forming layer is reduced, applying heat-pressure to the resulting material as shown in FIG. 2(*b*), and peeling the peeling layer from the image forming layer whereby the exposed portions of the image forming layer is transferred to the peeling layer side to form an image as shown in FIG. 2(*c*).

The image forming methods 1, 2 and 3 have a problem that the exposed image forming layer scatters around due to an exposure condition at a high density energy light exposure, but according to the image forming method 4 an image is formed without scattering of the exposed portions, since the peeling layer is provided on the image forming layer.

In this image forming method, the image forming material includes a material in which an image forming layer adheres to a peeling layer and a material in which an image forming layer does not adhere to, but is only in close contact with, a peeling layer.

In the latter case, when the latter material is imagewise exposed to a high density energy light so that a binding force between the image forming layer and the support is reduced, exposed portions of the image forming layer, in which the binding force is reduced, is transferred to a peeling layer by heat or scatter, so that only peeling of the image forming layer produces an image or a part of the exposed portions are transferred to a peeling layer, according to the peeling layer composition. When the image forming layer of an image forming material is prepared not to deform due to heat conduction from the image forming layer or reduction between the image forming layer and support, which is obtained by incorporating fillers in the image forming layer and producing some space between the image forming layer and peeling layer, the image forming material is subjected to a heat pressure treatment (see FIG. 2*b*) after imagewise exposure, and then the peeling layer is separated from the image forming layer to transfer the exposed portions to the peeling layer.

The image forming methods 1, 2 and 3 have a problem that the exposed image forming layer scatters around due to an exposure condition in a high density energy light exposure, but according to the image forming method 4 an image is formed without scattering of the exposed portions, since the peeling layer is provided on the image forming layer.

The imagewise exposure by a high density energy light can be carried out in the same manner as in the image forming method 1, and the method of peeling the peeling layer from the image forming layer can be carried out in the same manner as the peeling method of the image forming method 3.

EXAMPLES

The invention is hereunder described with examples, but the scope of the invention is by no means limited to them. In the examples, all "parts" are parts by weight, unless otherwise specified.

Example 1

Image forming material

The inventive image forming material and comparative image forming material were prepared using a support, an image forming layer, and a peeling layer as shown below. The thus obtained materials are shown in Table 1.

Support (1) T-600:100 μm transparent polyethylene terephthalate film which have anchor coat on each side produced by Diafoil Hoechst Co., Ltd.

(2) T-100 G:100 μm transparent polyethylene terephthalate film which is subjected to anti-static treatment on one side and to corona discharge on the image forming layer or an image forming layer side produced by Diafoil Hoechst Co., Ltd.

(3) T-100:100 μm transparent polyethylene terephthalate film which is subjected to corona discharge on the image forming layer or an image layer side, produced by Diafoil Hoechst Co., Ltd.

Image forming layer

1) The following composition was kneaded and dispersed with a pressure kneader to obtain an image forming layer coating solution containing metal atom containing particles. The resulting coating solution was coated on a support, subjected to magnetic orientation before drying, dried and subjected to calendering at a pressure of 150 kg/cm to give a dry thickness of 1.2 μm. The resulting image forming layer had an optical density per 1 μm thickness of 830 nm light of 4.1, transmittance of per 1 μm thickness of 830 nm light of 0.008%, a metal containing powder content by volume of 50%, and a metal containing powder content by weight of 74%.

| | |
|---|---|
| Fe—Al ferromagnetic metal powder (Fe:Al ratio in number of atoms:overall average = 100:4, surface layer = 50:50, average major axial length = 0.14 μm, Hc: 1760 ersted, σs: 120 emu/g, BET value = 53 $m^2/g$) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

2) The above composition was added with 5 parts of carbon black (average particle size of 20 nm, DBP oil absorption of 100 ml/100 g), kneaded and dispersed with a pressure kneader to obtain an image forming layer coating solution containing metal atom containing particles. The resulting coating solution was coated on a support, subjected to magnetic orientation before drying, dried and subjected to calendering at a pressure of 150 kg/cm to give a dry thickness of 1.0 μm. The resulting image forming layer had an optical density per 1 μm thickness of 830 nm light of 4.0, transmittance of per 1 μm thickness of 830 nm light of 0.01%, a metal containing powder content by volume of 45%, and a metal containing powder content by weight of 75%.

3) The following composition was kneaded and dispersed with a pressure kneader to obtain an image forming layer coating solution containing metal atom containing particles. The resulting coating solution was coated on a support, subjected to magnetic orientation before drying, dried and subjected to calendering at a pressure of 150 kg/cm to give a dry thickness of 1.0 μm. The resulting image forming layer had an optical density per 1 μm thickness of 830 nm light of 4.0, transmittance of per 1 μm thickness of 830 nm light of 0.01%, a metal containing powder content by volume of 47%, and a metal containing powder content by weight of 74%.

| | |
|---|---|
| Fe—Al ferromagnetic metal powder (Fe:Al ratio in number of atoms:overall average = 100:6, surface layer 50:90, average major axial length = 0.15 μm, Hc: 1700 ersted, σs: 115 emu/g, BET value = 53 $m^2/g$) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Carbon black (average particle size: 0.04 μm) | 0.5 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

4) The above composition was headed and dispersed with a pressure header to obtain an image forming layer coating solution containing metal atom containing particles. The resulting coating solution was coated on a support, subjected to magnetic orientation before drying, dried and subjected to calendering at a pressure of 150 kg/cm to give a dry thickness of 1.3 μm. The resulting image forming layer had an optical density per 1 μm thickness of 830 nm light of 4.0, transmittance of per 1 μm thickness of 830 nm light of 0.01%, a metal containing powder content by volume of 47%, and a metal containing powder content by weight of 74%.

5) The image forming layer was formed in the same manner as in 3) above, except that Co coating $FeO_x$ powder (average major axial length=0.45 μm, Hc:750 ersted, BET value=45 $m^2/g$, X=1.417) was used instead of the above Fe-Al ferromagnetic metal powder. The resulting image forming layer has an optical density per 1 μm of 600 nm light of 3.9 and a metal containing powder content by volume of 55%. The resulting image forming layer had an optical density per 1 μm thickness of 600 nm light of 3.9, transmittance of per 1 μm thickness of 600 nm light of 0.01%, a metal containing powder content by volume of 55%, and a metal containing powder content by weight of 74%.

6) The image forming layer of 1) above was coated and dried on a support to have a thickness of 0.5 μm. The following composition was kneaded and dispersed with a sand mill to obtain a image forming layer 2 coating solution containing metal atom containing particles. The resulting coating solution was coated on the above image forming layer according to an extrusion method, subjected to magnetic orientation before drying, dried and subjected to calendering at a pressure of 130 kg/cm to give a dry thickness of 0.7 μm. The resulting image forming layer 2 had an optical density per 1 μm thickness of 500 nm light of 3.5, transmittance per 1 μm thickness of 500 nm light of 0.03%, a metal containing powder content by volume of 54%, and a metal containing powder content by weight of 83%.

| | |
|---|---|
| Co—Ti—Nb substituted barium ferrite powder (average major axial length = 0.15 μm, Hc: 1000 ersted) | 100 parts |
| Sodiumsulfonate-containing polyurethane resin (UR8700 made by Toyobo Co., Ltd.) | 8 parts |
| a-Alumina (average particle size: 0.15 μm) | 5 parts |
| Carbon black (average particle size: 0.02 μm) | 1 part |
| Stearic acid | 3 parts |
| Butyl stearate | 2 parts |
| Polyisocyanate (Coronate L made by Nihon Urethane Kogyo Co., Ltd.) | 3 parts |
| Cyclohexanone | 120 parts |
| Toluene | 60 parts |

7) The image forming layer 2 was formed in the same manner as in 6) above, except that Co-Ti barium ferrite (average major axial length=0.43 μm, Hc:1100 ersted, BET value=46 $m^2/g$, aspect ratio:4) was used instead of the Co-Ti-Nb substituted barium ferrite powder. The resulting image forming layer 2 had an optical density per 1 μm thickness of 500 nm light of 3.6, transmittance per 1 μm thickness of 500 nm light of 0.025%, a metal containing powder content by volume of 53%, and a metal containing powder content by weight of 83%.

8) The following composition was kneaded and dispersed with an open kneader to obtain an image forming layer coating solution containing a colorant. The resulting coating solution was extrusion-coated and dried on a support, and subjected to calendering at a pressure of 150 kg/cm to give a dry thickness of 1.3 μm. The resulting image forming layer had an optical density per 1 μm thickness of 830 nm light of 2.3, transmittance per 1 μm thickness of 830 nm light of 0.5%, a metal containing powder content by volume of 35%, and a metal containing powder content by weight of 38%.

| | |
|---|---|
| Carbon black (average particle size: 0.04 μm) | 25 parts |
| Potassiumsulfonate-containing vinyl chloride resin (MR110 made by Nippon Zeon Co., Ltd.) | 13 parts |
| Sodiumsulfonate-containing polyurethane resin (UR8700 made by Toyobo Co., Ltd.) | 13 parts |
| a-Alumina (average particle size: 0.15 μm) | 8 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 80 parts |
| Methyl ethyl ketone | 80 parts |
| Toluene | 80 parts |

9) The image forming layer was formed in the same manner as in 8) above, except that graphite (average grain size=0.03 μm) was used instead of carbon black. The resulting image forming layer 2 had an optical density per 1 μm thickness of 830 nm light of 2.7, transmittance per 1 μm thickness of 830 nm light of 0.3%, a metal containing powder 1 μm content by volume of 40%, and a metal containing powder content by weight of 38%.

Peeling layer

1) The following adhesion layer coating solution was coated and dried on a 25 μm transparent polyethylene terephthalate film S-100 (produced by Diafoil Hoechst Co., Ltd.), which is a peeling layer, to obtain an adhesion layer having a thickness of 4.0 μm.

Thereafter, an image forming layer was superposed to face the adhesion layer. The resulting material was subjected to air-tight pressure treatment using a pressure roller (transport speed:30 mm/second, applied pressure:2.0 kg/cm). Thus, an image forming material was obtained which comprises a support and provided thereon, an image forming layer and a peeling layer in that order.

| | |
|---|---|
| Copoly ethylene-vinyl acetate (Evaflex EV410, produced by Mitsui Dupont Chemical Co., Ltd.) | 3.0 parts |
| Silicone fine particles (Tospar prodused by Toshiba Silicone Co., Ltd.) | 0.6 parts |
| Toluene | 90 parts |
| Cyclohexanone | 6.4 parts |

2) The hot-melt type adhesion agent (Hirodin 7524, produced by Hitodin Co., Ltd.) was melt-extrusion coated on a 25 μm transparent polyethylene terephthalate film, which is a peeling layer, to obtain an adhesion layer having a thickness of 20 μm.

Figure 3:
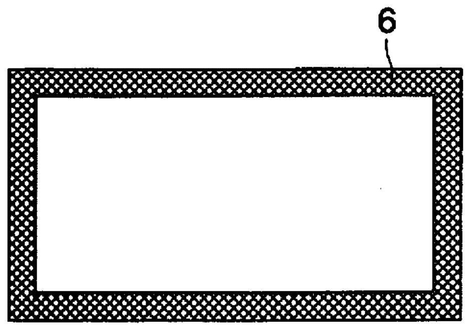
FIG. 3 shows a plane view of an image forming material comprising a support and provided thereon, an image forming layer and a peeling layer in that order, in which the peeling layer was adhered to the image forming layer on the four edges (5), which are not image portions.

Thereafter, an image forming layer was superposed to face the adhesion layer. The superposed material was temporarily adhered on the four edges 6, which are not image portions, as described in FIG. 3, by applying pressure treatment using a hot stamper (temperature:100° C., applied pressure:3.5 kg/cm). Thus, an image forming material was obtained which comprises a support and provided thereon, an image forming layer and a peeling layer in that order.

TABLE 1

| Image forming material | Support | Image forming layer | Peeling layer |
|---|---|---|---|
| 1 | 1 | 1 | |
| 2 | 1 | 2 | |
| 3 | 1 | 3 | |
| 4 | 1 | 4 | |
| 5 | 1 | 5 | |
| 6 | 1 | 6 | |
| 7 | 1 | 7 | |
| 8 | 2 | 1 | |
| 9 | 2 | 2 | |
| 10 | 2 | 3 | |
| 11 | 2 | 4 | |
| 12 | 2 | 5 | |
| 13 | 2 | 6 | |
| 14 | 2 | 7 | |
| 15 | 3 | 1 | |
| 16 | 3 | 2 | |
| 17 | 3 | 3 | |
| 18 | 3 | 4 | |
| 19 | 3 | 5 | |
| 20 | 3 | 6 | |
| 21 | 3 | 7 | |
| 22 | 2 | 1 | 1 |
| 23 | 2 | 2 | 1 |
| 24 | 2 | 3 | 1 |
| 25 | 2 | 4 | 1 |
| 26 | 2 | 5 | 1 |
| 27 | 2 | 6 | 1 |
| 28 | 2 | 7 | 1 |
| 29 | 2 | 1 | 2 |
| 30 | 2 | 2 | 2 |
| 31 | 2 | 3 | 2 |
| 32 | 2 | 4 | 2 |
| 33 | 2 | 5 | 2 |
| 34 | 2 | 6 | 2 |
| 35 | 2 | 7 | 2 |
| 36 | 3 | 1 | 2 |
| 37 | 3 | 2 | 2 |
| 38 | 3 | 3 | 2 |
| 39 | 3 | 4 | 2 |
| 40 | 3 | 5 | 2 |
| 41 | 3 | 6 | 2 |
| 42 | 3 | 7 | 2 |
| 43 | 1 | 8 | |
| 44 | 1 | 9 | |
| 45 | 2 | 9 | |
| 46 | 3 | 9 | |
| 47 | 2 | 8 | 1 |
| 48 | 2 | 9 | 1 |
| 49 | 2 | 8 | 2 |
| 50 | 3 | 8 | 2 |
| 51 | 2 | 10 | 1 |
| 52 | 2 | 11 | 1 |
| 53 | 2 | 10 | 2 |
| 54 | 2 | 11 | 2 |

Image forming method

The image forming material was imagewise scanning exposed from the support side, focussed on the interface between the support and the image forming layer using a semiconductor laser (LTO90MD, main wavelength:830 nm, produced by sharp Co., Ltd.). The image forming layer was superposed to face the adhesion layer of adhesion tape Scotch No. 845 book tape produced by 3M Co., Ltd.), and subjected to airtight pressure treatment using a pressure roller (transport speed:30 mm/second, applied pressure:3.0 kg/cm). The resulting material was fixed on the plate and then, the peeling layer was separated from the image forming layer (at a peeling angle of 90° and a peeling speed of 40 mm/second). Thus, exposed portions, in which a binding force was reduced by a high density energy light exposure, were transferred to the adhesion layer to form an image.

Sensitivity, resolving power of the image formed and remaining rate of the exposed portions remained after the transfer were evaluated according to the following criteria.

Sensitivity

The average exposure amount (E, $mJ/cm^2$) on the image forming material surface was measured which is necessary to form a solid image of 0.5 mm×0.5 mm by seaming exposing with a light having a beam diameter of 4 μm, using the above semiconductor laser, and sensitivity was evaluated according to the following five stages.

5 E≦100
4 100<E≦250
3 250<E≦400
2 400<E≦600
1 600<E

Resolving power

The imagewise scanning exposure was carried out to form an image at an average exposure amount at a scanning pitch of 4 μm with a light having a beam diameter of 4 μm, and resolving power of the image formed was evaluated in terms of lines N per 1 mm, which are resolved, according to the following four stages.

4 125≦N
3 120≦N<125
2 110≦N<120
1 N<110

Remaining image density

The imagewise exposure was carried out to form a solid image of 0.5 mm×0.5 mm by scanning exposing with a light having a beam diameter of 4 μm, and an optical density (OD:measured transparent density minus transparent density of the support) at exposed portions was measured using a densitometer (X-rite 310Tr produced by X-rite Co., Ltd.) and evaluated according to the following four stages.

4 OD≦0.060
3 0.060<OD≦0.100
2 0.100<OD≦0.250
1 0.250<OD

Optical density and transmittance

An image forming layer was provided on a support and the optical density and transmittance were measured by an optical densitometer X-rite 310TR produced by X-rite Co., Ltd. After the thickness measurement, the optical density and transmittance per 1 μm thickness were calculated.

2) The image forming material was imagewise scanning exposed from the support side, focussed on the image forming layer using a semiconductor laser. The resulting material was fixed on the plate facing the support and then, subjected to heat pressure treatment using a heat roller (transport speed:30 mm/second, temperature:80° C., pressure:2.0 kg/cm). Thereafter, the peeling layer was separated from the image forming layer (at a peeling angle of 80° and a peeling speed of 30 mm/second). Thus, exposed portions, in which a binding force was reduced by a high density energy light exposure, were transferred to the adhesion layer to form an image.

Sensitivity, resolving power of the image formed and remaining rate of the exposed portions remained after the transfer were evaluated in the same manner as 1) above.

The results are shown in Table 2.

TABLE 2

| | Image forming method | Image forming material | Sensitivity | Resolving power | Remaining image density |
|---|---|---|---|---|---|
| Example 1 | 1 | 1 | 4 | 3 | 4 |
| Example 2 | 1 | 2 | 4 | 3 | 4 |
| Example 3 | 1 | 3 | 4 | 3 | 4 |
| Example 4 | 1 | 4 | 4 | 3 | 4 |
| Example 5 | 1 | 5 | 4 | 3 | 4 |
| Example 6 | 1 | 6 | 4 | 3 | 4 |
| Example 7 | 1 | 7 | 4 | 3 | 4 |

TABLE 2-continued

| | Image forming method | Image forming material | Sensitivity | Resolving power | Remaining image density |
|---|---|---|---|---|---|
| Example 8 | 1 | 8 | 4 | 4 | 4 |
| Example 9 | 1 | 9 | 4 | 4 | 4 |
| Example 10 | 1 | 10 | 4 | 4 | 4 |
| Example 11 | 1 | 11 | 4 | 4 | 4 |
| Example 12 | 1 | 12 | 4 | 4 | 4 |
| Example 13 | 1 | 13 | 4 | 4 | 4 |
| Example 14 | 1 | 14 | 4 | 4 | 4 |
| Example 15 | 1 | 15 | 4 | 4 | 4 |
| Example 16 | 1 | 16 | 4 | 4 | 4 |
| Example 17 | 1 | 17 | 4 | 4 | 4 |
| Example 18 | 1 | 18 | 4 | 4 | 4 |
| Example 19 | 1 | 19 | 4 | 4 | 4 |
| Example 20 | 1 | 20 | 4 | 4 | 4 |
| Example 21 | 1 | 21 | 4 | 4 | 4 |
| Example 22 | 2 | 22 | 4 | 4 | 4 |
| Example 23 | 2 | 23 | 4 | 4 | 4 |
| Example 24 | 2 | 24 | 4 | 4 | 4 |
| Example 25 | 2 | 25 | 4 | 4 | 4 |
| Example 26 | 2 | 26 | 4 | 4 | 4 |
| Example 27 | 2 | 27 | 4 | 4 | 4 |
| Example 28 | 2 | 28 | 4 | 4 | 4 |
| Example 29 | 2 | 29 | 4 | 4 | 4 |
| Example 30 | 2 | 30 | 4 | 4 | 4 |
| Example 31 | 2 | 31 | 4 | 4 | 4 |
| Example 32 | 2 | 32 | 4 | 4 | 4 |
| Example 33 | 2 | 33 | 4 | 4 | 4 |
| Example 34 | 2 | 34 | 3 | 4 | 4 |
| Example 35 | 2 | 35 | 3 | 4 | 4 |
| Example 36 | 2 | 36 | 4 | 4 | 4 |
| Example 37 | 2 | 37 | 4 | 4 | 4 |
| Example 38 | 2 | 38 | 4 | 4 | 4 |
| Example 39 | 2 | 39 | 4 | 4 | 4 |
| Example 40 | 2 | 40 | 4 | 4 | 4 |
| Example 41 | 2 | 41 | 3 | 4 | 4 |
| Example 42 | 2 | 42 | 3 | 4 | 4 |
| Example 85 | 2 | 51 | 3 | 4 | 3 |
| Example 86 | 2 | 52 | 3 | 4 | 3 |
| Example 87 | 2 | 53 | 3 | 4 | 4 |
| Example 88 | 2 | 54 | 3 | 4 | 3 |
| Comparative Example 1 | 1 | 43 | 3 | 1 | 1 |
| Comparative Example 2 | 1 | 44 | 3 | 1 | 1 |
| Comparative Example 3 | 1 | 45 | 2 | 1 | 1 |
| Comparative Example 4 | 1 | 46 | 2 | 1 | 1 |
| Comparative Example 5 | 2 | 47 | 1 | 1 | 1 |
| Comparative Example 6 | 2 | 48 | 1 | 1 | 1 |
| Comparative Example 7 | 2 | 49 | 1 | 1 | 1 |
| Comparative Example 8 | 2 | 50 | 1 | 1 | 1 |

3) The image was formed in the same manner as in 1) above, except that YAG laser DPY521C-NP (output:4000 mW, main wavelength:1064 μm) produced by Adlas Co., Ltd.) was used, and the same evaluation as 1) above was conducted.

4) The image was formed in the same manner as in 2) above, except that the YAG laser was used, and the same evaluation as 1) above was conducted.

The results are shown in Table 3.

TABLE 3

| | Image forming method | Image forming material | Sensitivity | Resolving power | Remaining image density |
|---|---|---|---|---|---|
| Example 43 | 3 | 1 | 5 | 4 | 4 |
| Example 44 | 3 | 2 | 5 | 4 | 4 |
| Example 45 | 3 | 3 | 5 | 4 | 4 |
| Example 46 | 3 | 4 | 5 | 4 | 4 |
| Example 47 | 3 | 5 | 5 | 4 | 3 |
| Example 48 | 3 | 6 | 5 | 4 | 4 |
| Example 49 | 3 | 7 | 5 | 4 | 4 |
| Example 50 | 3 | 8 | 5 | 4 | 4 |
| Example 51 | 3 | 9 | 5 | 4 | 4 |
| Example 52 | 3 | 10 | 5 | 4 | 4 |
| Example 53 | 3 | 11 | 5 | 4 | 4 |
| Example 54 | 3 | 12 | 5 | 4 | 3 |
| Example 55 | 3 | 13 | 5 | 4 | 4 |
| Example 56 | 3 | 14 | 5 | 4 | 4 |
| Example 57 | 3 | 15 | 5 | 4 | 4 |
| Example 58 | 3 | 16 | 5 | 4 | 4 |
| Example 59 | 3 | 17 | 5 | 4 | 4 |
| Example 60 | 3 | 18 | 5 | 4 | 4 |
| Example 61 | 3 | 19 | 5 | 4 | 3 |
| Example 62 | 3 | 20 | 5 | 4 | 4 |
| Example 63 | 3 | 21 | 5 | 4 | 4 |
| Example 64 | 4 | 22 | 5 | 4 | 4 |
| Example 65 | 4 | 23 | 5 | 4 | 4 |
| Example 66 | 4 | 24 | 5 | 4 | 4 |
| Example 67 | 4 | 25 | 5 | 4 | 4 |
| Example 68 | 4 | 26 | 5 | 4 | 3 |
| Example 69 | 4 | 27 | 5 | 4 | 4 |
| Example 70 | 4 | 28 | 5 | 4 | 4 |
| Example 71 | 4 | 29 | 5 | 4 | 4 |
| Example 72 | 4 | 30 | 5 | 4 | 4 |
| Example 73 | 4 | 31 | 5 | 4 | 4 |
| Example 74 | 4 | 32 | 5 | 4 | 4 |
| Example 75 | 4 | 33 | 5 | 4 | 3 |
| Example 76 | 4 | 34 | 5 | 4 | 4 |
| Example 77 | 4 | 35 | 5 | 4 | 4 |
| Example 78 | 4 | 36 | 5 | 4 | 4 |
| Example 79 | 4 | 37 | 5 | 4 | 4 |
| Example 80 | 4 | 38 | 5 | 4 | 4 |
| Example 81 | 4 | 39 | 5 | 4 | 4 |
| Example 82 | 2 | 40 | 5 | 4 | 3 |
| Example 83 | 2 | 41 | 5 | 4 | 4 |
| Example 84 | 2 | 42 | 5 | 4 | 4 |
| Example 89 | 4 | 51 | 4 | 3 | 4 |
| Example 90 | 4 | 52 | 4 | 4 | 3 |
| Example 91 | 4 | 53 | 4 | 4 | 4 |
| Example 92 | 4 | 54 | 4 | 4 | 3 |
| Comparative Example 9 | 3 | 43 | 4 | 1 | 1 |
| Comparative Example 10 | 3 | 44 | 4 | 1 | 1 |
| Comparative Example 11 | 3 | 45 | 3 | 1 | 1 |
| Comparative Example 12 | 3 | 46 | 3 | 1 | 1 |
| Comparative Example 13 | 4 | 47 | 3 | 1 | 1 |
| Comparative Example 14 | 4 | 48 | 3 | 1 | 1 |
| Comparative Example 15 | 4 | 49 | 3 | 1 | 1 |
| Comparative Example 16 | 4 | 50 | 3 | 1 | 1 |

Example 2

The constitution of the peeling layer used in the invention was varied and evaluated for staining.

Image forming material

The inventive or comparative image forming material was prepared using a support, an image forming layer and a peeling layer described below.

Support

Twentyfive μm transparent polyethylene terephthalate film (T-100, produced by Diafoil Hoechst Co., Ltd.) which is corona discharged on the image forming layer Image forming layer Image forming layer 1

The following composition was headed and dispersed with an open header to obtain an image forming layer coating solution containing metal containing powder. The resulting coating solution was extrusion coated on a support, subjected to magnetic orientation before drying, dried and subjected to calendering to give a dry thickness of 1.2 μm.

The resulting image forming layer had an optical density per 1 μm thickness of 830 nm light of 4.0, transmittance per 1 μm thickness of 830 nm light of 0.01%, a metal containing powder content by volume of 45%, and a metal containing powder content by weight of 71%.

| | |
|---|---|
| Fe—Al ferromagnetic metal powder (colorant and metal containing powder; Fe:Al ratio in number of atoms:overall average = 100:4, surface layer = 50:50, average major axial length = 0.14 μm) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| a-Alumina (average particle size: 0.15 μm) | 8 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

Peeling layers 1 through 13

The following fine particles which have different average particle size were added in various amounts to a binder solution containing 10% polyvinyl alcohol resin (Gosenol GL05 produced by Hihon Goseikagaku Co., Ltd.) and subjected to a ultrasonic dispersion. The resulting solution was coated on a 100 μm transparent polyethylene terephthalate film (T-100 produced by Diafoil Hoechst Co. Ltd.), which is corona discharged on an image forming layer side, by a wire bar and dried to obtain a peeling layer as shown in Table 4.

The number in an area of 1 $cm^2$ of fine particles which protrude 1 μm or more from the surface of the peeling layer was counted using a microscope. The number was divided by 100 to obtain a protruding fine particle number per 1 $mm^2$.

Fine particles

Monodispersed PE particles FIX-300 (average particle size: 3.0 μm, produced by Soken Kagaku Co., Ltd.)

Monodispersed PMMA particles MX-1500 (average particle size: 15.0.0 μm, produced by Soken Kagaku Co., Ltd.)

Silicone resin fine particles Tospar 108 (average particle size: 0.8 μm, produced by Toshiba Silicone Co., Ltd.)

Silicone resin fine particles Tospar 145 (average particle size: 4.5 μm, produced by Toshiba Silicone Co., Ltd.)

Silicone resin fine particles Tospar 3120 (average particle size: 12.0 μm, produced by Toshiba Silicone Co., Ltd.)

Image forming method

The image forming material was imagewise exposed from the support side, focussed on the image forming layer using a semiconductor laser (LTO90MD, main wavelength:830 nm, produced by sharp Co., Ltd.). The image forming layer, in which a binding force at exposed portions was reduced by the laser exposure, was separated from the peeling layer to form an image.

The transparent density of the exposed portions, staining remain of the exposed portions, was evaluated according to the following criteria.

Transparent density

The visual light transparent density D at exposed portions of the image forming material was measured using a densitometer (X-rite 310Tr produced by X-rite Co., Ltd.) according to the following four stages.

A $D \leqq 0.030$ (excellent)

B $0.040 \leqq D \leqq 0.05$ (Slight image forming layer remained is observed by a microscope, and no problem)

C $0.06 \leqq D \leqq 0.09$ (Image forming layer remained after transfer is observed by a roupe)

D $0.10 \leqq D$ (Image forming layer after transfer is observed)

TABLE 4

| Peeling layer | Thickness μm | Average particle size μm | Protruding number number/mm$^2$ | Transparent density | Material name | Maker | Fine particles material |
|---|---|---|---|---|---|---|---|
| 1 | 6.0 | 15.0 | 5 | D | MX-1500 | Soken Kagaku | Acryl resin |
| 2 | 6.0 | 15.0 | 8 | D | MX-1500 | Soken Kagaku | Acryl resin |
| 3 | 6.0 | 15.0 | 10 | B | MX-1500 | Soken Kagaku | Acryl resin |
| 4 | 6.0 | 15.0 | 20 | B | MX-1500 | Soken Kagaku | Acryl resin |
| 5 | 6.0 | 15.0 | 50 | A | MX-1500 | Soken Kagaku | Acryl resin |
| 6 | 20.0 | 15.0 | 50 | B | MX-1500 | Soken Kagaku | Acryl resin |
| 7 | 5.0 | 4.5 | 100 | A | Tospar 145 | Toshiba Silicone | Silicone resin |
| 8 | 5.0 | 4.5 | 9 | D | Tospar 145 | Toshiba Silicone | Silicone resin |
| 9 | 5.0 | — | 0 | D | None | | |
| 10 | 0.5 | 0.8 | 0 | D | Tospar 108 | Toshiba Silicone | Silicone resin |
| 11 | 0.5 | 0.8 | 50 | C | Tospar 108 | Toshiba Silicone | Silicone resin |
| 12 | 5.0 | 3.0 | 20 | B | MX-300 | Soken Kagaku | Acryl resin |
| 13 | 5.0 | 12.0 | 200 | A | Tospar 3120 | Toshiba Silicone | Silicone resin |

As is apparent from Table 4, the peeling layer used in the invention gives an excellent transparent density (OD a measure of staining).

Example 3

Peeling layers 20 through 25

The transparent polyethylene terephthalate film used in Example 2 is surface roughened according to sand blast treatment on the one side of the support, and the surface roughness of the sand blasted surface was varied to obtain a peeling layer. The same processing as in example 2 was carried out using the above obtained peeling layer and the image forming material prepared in Example 2. The results are shown in Table 5.

The peeling layer 20 is not surface roughened.

The surface roughness was measured using a surface roughness meter SurfSorder SEF-30D produced by Kosaka Co., Ltd. Thus, a center line average surface roughness was measured at a 20000 longitudinal multiplication, a 0.08 mm cut-off, a 2.5 mm of standard length and at a feed speed of 0.1 mm/second.

Resolving power

The imagewise scanning exposure was carried out to form an image at an average surface exposure amount at a scanning pitch of 6 μm with a light having a beam diameter of 6 μm, and resolving power of the image formed was evaluated in terms of line number N per 1 mm, which are resolved, according to the following criteria.

A $80 < N$

B $40 \leqq N \leqq 80$

C $20 \leqq N < 40$

D $N < 20$

TABLE 5

| Peeling layer | $R_a$ | Transparent density | Resolving Power | Remarks |
|---|---|---|---|---|
| 20 | 0.016 | D | C | Invention |
| 21 | 0.04 | B | A | Invention |
| 22 | 0.10 | B | A | Invention |
| 23 | 0.50 | A | A | Invention |
| 24 | 1.00 | B | B | Invention |
| 25 | 2.00 | D | D | Invention |

As is apparent from Table 5, the peeling layer used in the invention gives an excellent transparent density (OD a measure of staining) and resolving powder.

Example 5

The image forming layer coating solution prepared in Example 3 was coated on the corona-discharged surface side of a 100 μm transparent polyethylene terephthalate film T-100 (produced by Diafoil Hoechst Co., Ltd.) in the same manner as in example 3 to obtain a 1.1 μm image forming layer. A 10% polyurethane resin Nippolane 3116 (produced by Nippon Polyurethane Kogyo Co., Ltd.) solution of a mixture of methylethylketone/toluene/cyclohexanone (4/4/2) was coated on a 38 μm white polyethylene terephthalate film W-400 (produced by Diafoil Hoechst Co., Ltd.), and dried to form a peeling layer different in a surface roughness.

Thereafter, an image forming layer was superposed to face the peeling layer. The resulting material was subjected to air-tight pressure treatment using a pressure roller (transport speed:20 mm/second, applied pressure:2.0 kg/cm, applied temperature:80° C.). Thus, an image forming material was obtained. An image was formed in the same manner as in Example 3, using the above obtained image forming material.

The results are shown in Table 9.

TABLE 9

| Peeling layer | Thickness (μm) | $R_a$ (μm) | Transparent density | Resolving power |
|---|---|---|---|---|
| 26 | 0.2 | 0.15 | B | B |
| 27 | 0.5 | 0.12 | A | A |
| 28 | 0.8 | 0.08 | A | A |

TABLE 9-continued

| Peeling layer | Thickness (μm) | $R_a$ (μm) | Transparent density | Resolving power |
|---|---|---|---|---|
| 29 | 1.0 | 0.04 | B | B |
| 30 | 1.5 | 0.01 | D | D |

What is claimed is:

1. An image forming material comprising a support and provided thereon, an image forming layer containing colorant particles and a binder, the image forming layer having an optical density of 3.0 or more per 1 μm thickness of the image forming layer at λmax which is a wavelength giving the maximum optical density in the spectral absorption wavelength range of 350 to 1200 nm of the image forming layer, and the colorant particles are metal atom-containing particles wherein an image is formed by removing exposed portions of the image forming layer of the image forming material.

2. The image forming material of claim 1, wherein the thickness of the support is 10 to 500 μm.

3. The image forming material of claim 1, wherein the metal atom-containing particles are selected from the group consisting of a metal, an alloy and a metal compound.

4. The image forming material of claim 1, wherein the content of the metal atom-containing particles is 70 to 99 weight %.

5. The image forming material of claim 4, wherein the content of the metal atom-containing particles is 70 to 95 weight %.

6. The image forming material of claim 1, wherein the content of the metal atom-containing particles is 20 to 80 volume %.

7. The image forming material of claim 1, wherein the metal atom-containing particles have an average particle size of 0.03 to 0.50 μm.

8. The image forming material of claim 1, wherein the metal atom-containing particles are in a needle form.

9. The image forming material of claim 1, wherein the metal atom-containing particles are magnetic particles.

10. The image forming material of claim 1, wherein the binder is polyurethanes, polyesters or vinyl chloride resins.

11. The image forming material of claim 10, wherein the binder is resins containing a repeating unit containing a polar group selected from the group consisting of $—SO_3M$, $—OSO_3M$, —COOM and $—PO(OM_1)_2$, wherein M represents a hydrogen atom or an alkali atom; and $M_1$ represents a hydrogen atom, an alkali atom or an alkyl group.

12. The image forming material of claim 1, wherein the thickness of the image forming layer is 0.1 to 5.0 μm.

13. The image forming material of claim 12, wherein the thickness of the image forming layer is 0.1 to 1.6 μm.

14. The image forming material of claim 1, wherein a backing layer is provided on the support opposite the image forming layer.

15. The image forming material of claim 1, further containing an anti-static agent.

16. The image forming material of claim 1, wherein a peeling layer is provided on the image forming layer.

17. The image forming material of claim 16, wherein the peeling layer comprises fine particles, a part of the fine particles protruding from the peeling layer surface, and the number of fine particles having the protruding height of 1 to 20 μm being 10 or more per $mm^2$ of the peeling layer.

18. The image forming material of claim 16, wherein the surface roughness $R_a$ of the peeling layer surface facing the image forming layer is 0.04 to 1.0 μm, which is measured to JIS B0601.

* * * * *